US010303824B2

(12) United States Patent
Jeong et al.

(10) Patent No.: US 10,303,824 B2
(45) Date of Patent: May 28, 2019

(54) APPARATUS AND METHOD FOR SIMULATION OF DISMANTLING OPERATION OF NUCLEAR FACILITY

(71) Applicant: KOREA ATOMIC ENERGY RESEARCH INSTITUTE, Daejeon (KR)

(72) Inventors: Kwanseong Jeong, Sejong (KR); Jeikwon Moon, Daejeon (KR); Byungseon Choi, Daejeon (KR); Dongjun Hyun, Daejeon (KR); Jonghwan Lee, Daejeon (KR); Ikjune Kim, Daejeon (KR); Geunho Kim, Daejeon (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/743,792

(22) PCT Filed: Oct. 27, 2015

(86) PCT No.: PCT/KR2015/011361
§ 371 (c)(1),
(2) Date: Jan. 11, 2018

(87) PCT Pub. No.: WO2017/014359
PCT Pub. Date: Jan. 26, 2017

(65) Prior Publication Data
US 2018/0210979 A1    Jul. 26, 2018

(30) Foreign Application Priority Data

Jul. 20, 2015  (KR) .................... 10-2015-0102638

(51) Int. Cl.
*G06F 3/01* (2006.01)
*G09B 9/00* (2006.01)
(Continued)

(52) U.S. Cl.
CPC .......... *G06F 17/5009* (2013.01); *G06F 1/163* (2013.01); *G06F 3/011* (2013.01);
(Continued)

(58) Field of Classification Search
CPC ................................................... H04N 5/7491
See application file for complete search history.

(56) References Cited

U.S. PATENT DOCUMENTS

2016/0365162 A1* 12/2016 Johnson ................. G21D 1/003
2017/0169158 A1*  6/2017 Hyun ..................... G06F 17/50

FOREIGN PATENT DOCUMENTS

JP       H06-186340 A      7/1994
KR      20130015425 A      2/2013
(Continued)

OTHER PUBLICATIONS

Ishii et al. "Proposal and Evaluation of Decommissioning Supporting Method of Nuclear Power Plants using Augmented Reality", Transaction of the Virtual Reality Society of Japan, pp. 289-300, vol. 13 No. 2, 2008.*
(Continued)

*Primary Examiner* — Priyank J Shah
(74) *Attorney, Agent, or Firm* — Scully, Scott, Murphy & Presser, P.C.

(57) ABSTRACT

The present invention relates to a simulation of a nuclear facility dismantling operation, comprising: a database which includes information on at least one task constituting a nuclear facility dismantling operation and information on a virtual space related to the simulation of the dismantling operation; a plurality of head mounted displays (HMDs)
(Continued)

which receives inputs of users related to the simulation; a simulation unit which generates the virtual space, transmits to the plurality of HMDs, the image of the virtual space including operator objects corresponding to each of the users of the plurality of HMDs, and processes the simulation of the dismantling operation according to the inputs received from each HMD user, wherein, when simulations which are different in at least one of the number of the users and the progress order of the tasks are processed, the simulation unit compares the simulations on the basis of at least one of the number of the users or the progress order of the tasks and displays a comparison result.

14 Claims, 9 Drawing Sheets

(51) Int. Cl.
*G06Q 10/06* (2012.01)
*G21D 1/00* (2006.01)
*G06T 19/00* (2011.01)
*G06F 17/50* (2006.01)
*G06F 1/16* (2006.01)

(52) U.S. Cl.
CPC .............. *G06F 3/012* (2013.01); *G06F 17/50* (2013.01); *G06Q 10/0633* (2013.01); *G06Q 10/06316* (2013.01); *G06Q 10/063114* (2013.01); *G06Q 10/063118* (2013.01); *G06T 19/003* (2013.01); *G09B 9/00* (2013.01); *G21D 1/003* (2013.01); *Y02E 30/40* (2013.01)

(56) References Cited

FOREIGN PATENT DOCUMENTS

| KR | 20130122853 A | 11/2013 |
|----|---------------|---------|
| KR | 101536950 B1  | 7/2015  |

OTHER PUBLICATIONS

International Search Report dated Mar. 28, 2016 issued in PCT/KR2015/011361.

Iguchi, Yukihiro et al., "Development of Decommissioning Engineering Support System (DEXUS) of the Fugen Nuclear Power Station", Journal of Nuclear Science and Technology, Mar. 2004, vol. 41, No. 3, pp. 367-375.

Ishi, Hirotake et al., "Augmented Reality Applications for Nuclear Power Plant Maintenance Work", International Symposium on Symbiotic Nuclear Power Systems for 21st Century (ISSNP), pp. 262-268, See p. 267.

* cited by examiner

APPARATUS AND METHOD FOR SIMULATION OF DISMANTLING OPERATION OF NUCLEAR FACILITY

CROSS-REFERENCE TO RELATED APPLICATIONS

This application is the National Stage filing under 35 U.S.C. 371 of International Application No. PCT/KR2015/011361, filed on Oct. 27, 2015, which claims the benefit of earlier filing date and right of priority to Korean Application No. 10-2015-0102638, filed on Jul. 20, 2015, the contents of which are all hereby incorporated by reference herein in their entirety.

TECHNICAL FIELD

The present disclosure relates to simulation of decommissioning a nuclear facility.

BACKGROUND ART

In general, an operation of decommissioning nuclear facilities is performed in an environment of high radioactivity and high level of difficulty, so it is important to secure work safety. Also, in order to ensure safety of an operator who decommissions nuclear facilities, the decommissioning operation should be completed more safely and more promptly.

The decommissioning operation may include multiple tasks. Also, multiple operators may carry out such tasks sequentially or simultaneously. However, the tasks may have complicated associations. Thus, although multiple operators carry out multiple tasks, every task cannot be carried out simultaneously and the multiple tasks may be required to be carried out according to the order based associations between the tasks.

Meanwhile, optimal values of the tasks to be carried out simultaneously, the order of the tasks to be carried out based on associations, the number of required operators, and the like, may be determined through multiple experiments. That is, regarding the same decommissioning operation, results of the same decommissioning operation are measured by changing the number of operators, the task progress order, and the like, and an optimal number of operators required for the corresponding operation, an optimal task progress order, and the like, may be determined according to the measurement results.

However, the nuclear facilities have a high risk of exposure due to high radioactivity. Thus, it is difficult to carry out multiple experiments in the actual decommissioning operation site with the optimal number of operators in the optimal progress orders. Thus, a method for determining an optimal number of operators regarding a specific decommissioning operation, an optimal task progress order, that is, an operation course, even without carrying out multiple experiments on the current actual site, has been actively studied.

DISCLOSURE

Technical Problem

An aspect of the present disclosure provides an apparatus and method for simulating a nuclear facility decommissioning operation, capable of searching for an optimal number of operators and an optimal operation route regarding a specific decommissioning operation even without actually carrying out an experiment within a nuclear facility.

Another aspect of the present disclosure provides an apparatus and method for simulating a nuclear facility decommissioning operation, capable of allowing multiple operators to simultaneously simulate the same decommissioning operation process.

Technical Solution

According to an aspect of the present invention, there is provided an apparatus for simulating a decommissioning operation of a nuclear facility, including: a database including information on at least one task constituting a nuclear facility decommissioning operation and information regarding a virtual space related to the simulation of the decommissioning operation; a plurality of head mounted displays (HMDs) receiving inputs from users related to the simulation and outputting an image of the virtual space related to the simulation; and a simulation unit generating the virtual space, transmitting, to the plurality of HMDs, an image of the virtual space including operator objects respectively corresponding to the users of the plurality of HMDs, and performing the simulation of the decommissioning operation according to inputs received respectively from the HMD users, wherein, when simulations which are different in at least one of the number of the users and a progress order of the tasks are performed, the simulation unit compares at least one of measurement values measured from each simulation with at least one of the number of the users and the progress order of the tasks and displays a comparison result.

In an embodiment, the simulation unit may determine tasks performed by each user on the basis of a position or behavior of an operator object which performs simulation according to an input received from each operator object, and display information related to the tasks handled by each user on the plurality of HMDs.

In an embodiment, the simulation unit may further display information regarding a progress situation of the tasks on each of the plurality of HMDs.

In an embodiment, the measurement value may be at least one of an accumulated amount of radiation expose to each of the operator objects, an amount of waste generated as each task is in progress, and time required for each operator object to complete a specific task, while the simulation is being performed.

In an embodiment, when the simulation of decommissioning operation is terminated, the simulation unit may generate a simulation performing result including the measurement values, determine whether the simulated decommissioning operation has been successful or failed according to a preset reference, and further include a determination result in the measurement value.

In an embodiment, when a plurality of simulations in which the number of users and the progress order of tasks are the same are performed, the simulation unit may calculate a success rate of the simulated decommissioning operation regarding any one of the number of users and the progress order of the tasks on the basis of the number in which the decommissioning operation was successful among the plurality of simulations, and further include the calculated success rate as the measurement value.

In an embodiment, the preset reference may be at least one of whether all the tasks constituting the decommissioning operation have been completed within a preset time and whether an exposure does accumulated in the operator object exceeds a preset level.

In an embodiment, the simulation unit may display a measurement value measured to be greater or smaller than those of other simulation performing results by a preset level or greater, among measurement values measured from simulations in which at least one of the number of users and the progress order of the tasks is different, to be distinguished from other measurement values.

According to another aspect of the present invention, there is provided a method for simulating a decommissioning operation of a nuclear facility, including: analyzing tasks constituting an operation of decommissioning a nuclear facility selected as a simulation target; generating a virtual space related to the decommissioning operation and operator objects corresponding to the number of a plurality of head-mounted displays (HMDs) within the virtual space; displaying an image of the virtual space including the operator objects on each of the plurality of HMDs; performing simulation of the decommissioning operation within the virtual space through the operator objects according to an input received from a user of each of the plurality of HMDs; determining whether the simulation is terminated according to whether a preset conditions is met; and displaying a result obtained by comparing measurement values measured from simulations performed on the same decommissioning operation, among terminated simulations, with at least one of the number of users and the progress order of the tasks.

In an embodiment, the image of the virtual space may further include: information regarding tasks constituting the decommissioning operation.

In an embodiment, the displaying of the image of the virtual space may include: sensing a position or a behavior of an operator object performing the simulation; determining tasks performed by each operator object on the basis of the sensed position or behavior of the operator object; and displaying information regarding the tasks and the operator object which performs the tasks on each of the plurality of HMDs.

In an embodiment, the displaying of the information regarding the operator object may further include: information regarding a progress situation of the tasks.

In an embodiment, the measurement value may be at least one of an accumulated amount of radiation expose to each of the operator objects, an amount of waste generated as each task is in progress, and time required for each operator object to complete a specific task, while the simulation is being performed.

In an embodiment, the displaying of the comparison result may further include: displaying a measurement value measured to be greater or smaller than those of other simulation performing results by a preset level or greater, among the measurement values, to be distinguished from other measurement values.

Advantageous Effects

Therefore, in the present disclosure, even without carrying out multiple experiments on a decommissioning operation site of an actual nuclear facility, the number of operators required for the corresponding specific decommissioning operation and an optimal operation route regarding the specific decommissioning operation may be determined.

Also, in the present disclosure, since information regarding a progress situation of each task of a decommissioning operation currently in progress is provided to multiple operators in real time, multiple operators may be able to simultaneously simulate the same decommissioning operation process.

BEST MODES

Technical terms used in this specification are used to merely illustrate specific embodiments, and should be understood that they are not intended to limit the present disclosure. A singular representation may include a plural representation as far as it represents a definitely different meaning from the context. Terms 'include' or 'has' used herein should be understood that they are intended to indicate an existence of several components or several steps, disclosed in the specification, and it may also be understood that part of the components or steps may not be included or additional components or steps may further be included.

In describing the present invention, if a detailed explanation for a related known function or construction is considered to unnecessarily divert the gist of the present invention, such explanation has been omitted but would be understood by those skilled in the art.

Hereinafter, embodiments of the present disclosure will be described in detail with reference to the accompanying drawings. Here, among terms used in this disclosure, 'virtual space" refers to a virtual space corresponding to various actual nuclear facilities and refers to a virtual cubic space including various graphic objects through a tool such as a computer, or the like. Also, 'object' and 'operator object' refer to virtual objects included in the virtual space. Also, 'exposure dose' refers to an amount of radiation to which a human body is exposed.

Figure 1:
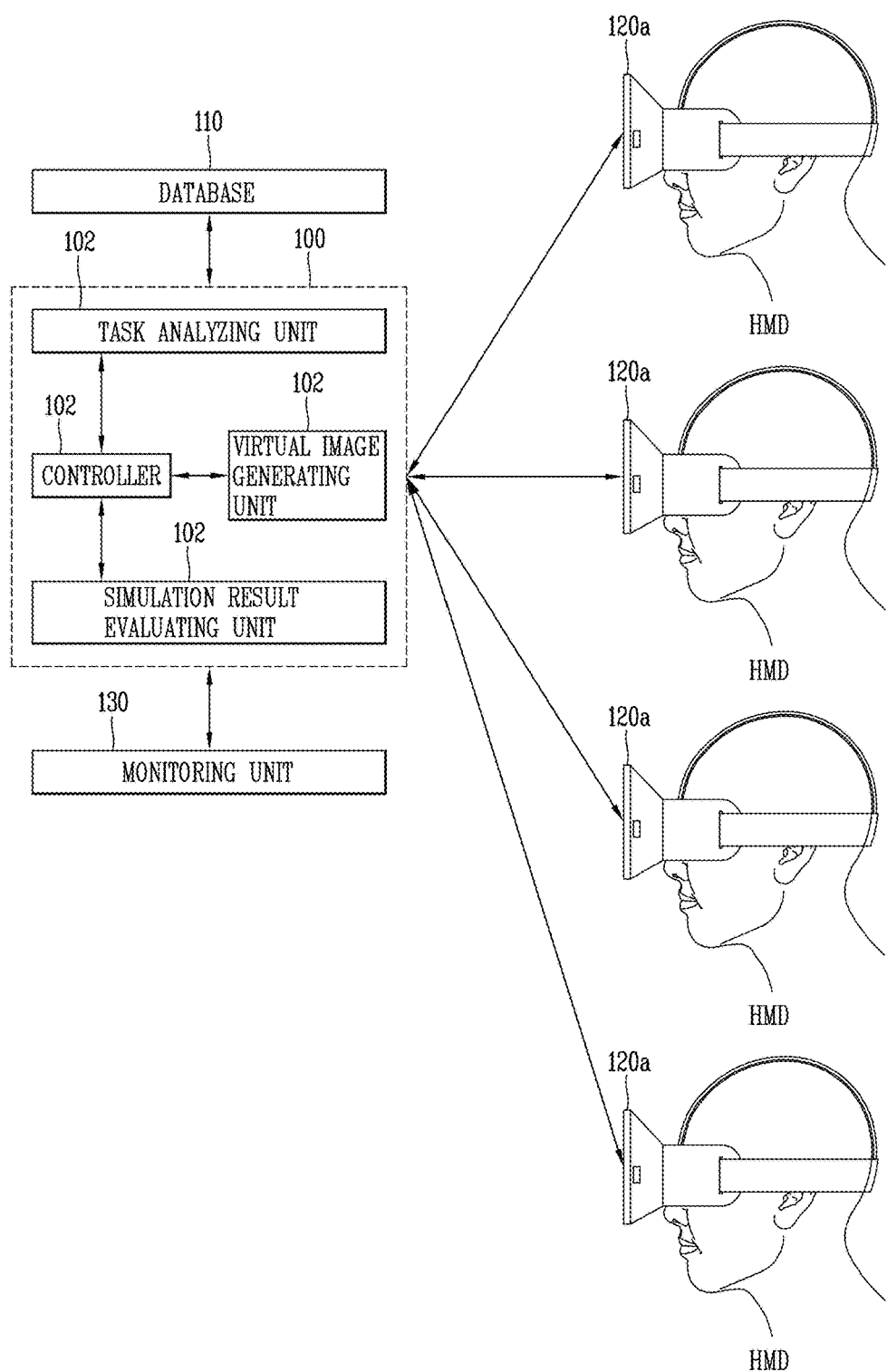
FIG. 1 is a block diagram illustrating components of an apparatus for simulating a nuclear facility decommissioning operation according to an embodiment of the present disclosure.

FIG. 1 is a block diagram illustrating components of an apparatus for simulating a nuclear facility decommissioning operation according to an embodiment of the present disclosure.

Referring to FIG. 1, an apparatus for simulating a decommissioning operation of a nuclear facility according to an embodiment of the present disclosure may include a simulation unit 100, a database 110 connected to the simulation unit 100, and a plurality of head-mounted displays (HMDs) 120, and may further include a monitoring unit 130.

Here the HMD 120 may be worn on a user's head, and a virtual image received from the simulation unit 110 may be displayed in a first person view. In addition, the HMD 120 may include a plurality of sensors capable of sensing a user's motion. The HMD 120 may sense a direction of the user's eyes or a user's motion and transmit a sensing result, as a user input related to the decommissioning operation simulation to the simulation unit 100. Here, the user may be an operator performing simulation.

For example, the HMD 120 may have an inertia sensor and a gravity sensor to sense pitch, yaw, and roll directions of the HMD 120. Also, the HMD 120 may recognize a direction of the user's eyes on the basis of results of sensing the pitch, yaw, and roll directions and transmit corresponding information to the simulation unit 100. Also, the HMD 120 may receive a virtual image corresponding to the recognized direction from the simulation unit 100 and display the same.

Also, the HMD 120 may receive an input from the user who wears the HMD 120 and transmit the received input to the simulation unit 100. For example, the HMD 120 may sense a motion of the user's hand or foot through a sensor capable of recognizing a gesture of the user's hand or foot and transmit the sensed motion as a user input to the simulation unit 100. Or, the HMD 120 may be connected to a separate input device (e.g., a keypad), or the like, for receiving the user input. In this case, the HMD 120 may transmit a key input signal input through the input device, as a user input, to the simulation unit 100.

As illustrated in FIG. 1, a plurality of HMDs 120 may be connected to the simulation unit 100. In this case, each HMD 120 may display mutual image information although it is a virtual image regarding one virtual space. That is, each HMD 120 may display image information viewing the visual space in mutually different directions according to a position or a behavior of each operator, and accordingly, each HMD 120 may display an image of other operator, i.e., an image of at least one user who wears another HMD 120.

In addition, the HMD 120 may display various types of information regarding a current simulation operation. For example, the HMD 120 may display information regarding tasks constituting the current simulation operation, and may display information regarding a progress situation of each of the tasks. As the information regarding the task progress situation, information regarding a current progress state of each task and each operator who carries out (or performs) the tasks may be displayed. Also, the information regarding the tasks may include information regarding an association between the tasks.

The database 110 includes various types of information required for performing simulation of the decommissioning operation of a nuclear facility according to an embodiment of the present disclosure. For example, the database 110 may store information regarding various decommissioning operations to be simulated, and store information required for a virtual image generating unit 106 to generate a virtual space and various types of information regarding an object and an operator object included in the virtual space. For example, the database 110 may store various types of equipment required for various decommissioning operation processes of the nuclear facility and information related to the equipment.

Also, the simulation unit 100 may control an overall process of the simulation of the nuclear facility decommissioning operation and transmit various types of information required for the simulation to each HMD 120. The simulation unit 100 may include a controller 102, and a task analyzing unit 104, a virtual image generating unit 106, and a simulation result evaluation unit 108 connected to the controller 102.

When simulation regarding a specific decommissioning operation is selected, the task analyzing unit 104 may read information regarding the selected operation from the database 110. The information read by the task analyzing unit 104 may include information regarding at least one task constituting the selected operation and information according to an association of each task. Also, in case where a specific tool or equipment is required for any one of the selected operation or the tasks, the task analyzing unit 104 may further include information regarding the corresponding equipment or tool.

The task analyzing unit 104 may read the information and analyze the read information by tasks. That is, the task analyzing unit 104 may analyze tasks included in the selected operation and an association between the tasks. The task analyzing unit 104 may transmit an analysis result to the controller 102 so that information regarding an operation or a task may be transmitted to at least one HMD 120 as necessary.

The virtual image generating unit 106 may generate a virtual space regarding a decommissioning site of the currently selected nuclear facility. For example, the virtual image generating unit 106 may receive previously input information of a specific nuclear facility or 2D or 3D drawing information generated using other tools such as a computer or the like, and generate the virtual image on the basis of the received information. Also, the virtual image generating unit 106 may generate an image of various objects included in the decommissioning operation site and operator objects respectively corresponding to the HMDs 120.

Here, various types of information for generating the virtual space, the objects included in the virtual space, and the operator objects, information regarding at least one decommissioning operation, and information regarding at least one task included in each of the decommissioning operation may be information stored in the database 110.

When the simulation is performed, the simulation unit 100 checks a progress process of the simulation performed through the simulation result evaluation unit 108, and evaluates the simulation which is in progress or which has been completed according to a progress state or termination of the simulation.

While the simulation is in progress or after the simulation is completed, the simulation result evaluation unit 108 may evaluate the simulation according to various preset references. The evaluation reference may include various references. For example, time required for performing the simulation, whether the simulation is successful, an exposure dose by which each operator is exposed to radiation, an amount of a waste generated during the simulation, and the like, may be used as the reference for evaluating the simulation.

For the evaluation, the simulation result evaluation unit 108 may collect or calculate a measurement result of the simulation currently in progress based on the evaluation reference according to a progress state of each task. Also, the simulation result evaluation unit 108 may collect or calculate an operator who currently performs each task and a measurement result of the operator. Also, when at least one or more simulation results are selected, the simulation result evaluation unit 108 may compare the selected simulation results.

The controller 102 may control each of the components connected thereto. That is, when a simulation regarding a specific operation is selected, the controller 102 may analyze tasks included in the operation and controls the virtual image generating unit 106 to generate a virtual space, an object, and at least one operator object according to the selected operation. Also, the controller 102 may sense an input according to a behavior of a hand or a foot of at least one operator, or a movement of a direction of eyes of the at least one operator, and control each HMD 120 to display corresponding image information. Also, the controller 102 may analyze tasks currently performed by each operator through an input such as a behavior, or the like, of each operator. Also, the controller 102 may display information regarding a progress situation of each task of each operator in at least a portion of the virtual image, so that information regarding the progress situation of each task may be shared by the operators.

The simulation unit 100 may display a result measured or calculated while the simulation is being performed or after the simulation is completed through the monitoring unit 130. The monitoring unit 130 may further include a display unit displaying image information viewing a situation within the visual space in a top view or quarter view direction, an input unit for receiving a key input from a previously designated manager, and the like.

Also, the monitoring unit 130 may display an image of the virtual space related to the simulation performed by each operator, while the simulation is in progress. Also, the monitoring unit 130 may display various types of information related to the operator, for example, time required for the simulation up to a specific time point, an amount of radiation to which an operator is exposed until a specific time point, an amount of a waste generated until a specific time point, and the like.

Meanwhile, the decommissioning operation simulation may be varied according to scenarios determined according to a user selection. For example, the user may select any one of scenarios regarding a decommissioning operation process of a nuclear facility or may select any one of scenarios related to various accident situations which may occur during a decommissioning operation of the nuclear facility.

Also, the scenarios related to the decommissioning operation process of the nuclear facility may be variously divided according to various decommissioning methods for decommissioning a nuclear facility and a plurality of preset skill levels. Also, the simulation unit 100 may select different decommissioning operation scenario according to a decommissioning method selected by the user and a skill level selected by the user, and performs different decommissioning simulation of a nuclear facility according to the selected scenario.

Also, scenario related to accident situations which may occur during an operation of decommissioning a nuclear facility may be variously differentiated. Also, the simulation unit 100 may perform different decommissioning operation simulations of a nuclear facility on the basis of a scenario related to a specific accident situation selected by the user.

Also, while performing a simulation, the simulation unit 100 may cause an accident situation scenario different from the currently selected scenario. For example, on the basis of a preset probability, when a specific operator object accesses a specific point, or when a specific operator object takes a specific action, the simulation unit 100 may cause a corresponding accident situation scenario.

This is based on a case where an accident occurs unexpectedly to an operator and it is to improve user's ability to cope with an accident situation. Here, whether the accident situation scenario occurs may be previously determined by the user or a designated manager before the simulation is performed.

To this end, the database 110 may store information regarding various scenarios related to the separate accident situation and may store information regarding conditions in which the separate accident situation may occur.

The database 110 may store various types of information related to operators who carry out the simulation of the operation of decommissioning a nuclear facility. For example, the database 110 may store personal data of each operator, i.e., a type of job, a position, a training time, of each operator, and the like. When the decommissioning operation simulation is terminated, the database 110 may further store information related to a skill level of each operator regarding the decommissioning operation simulation.

Figure 2:
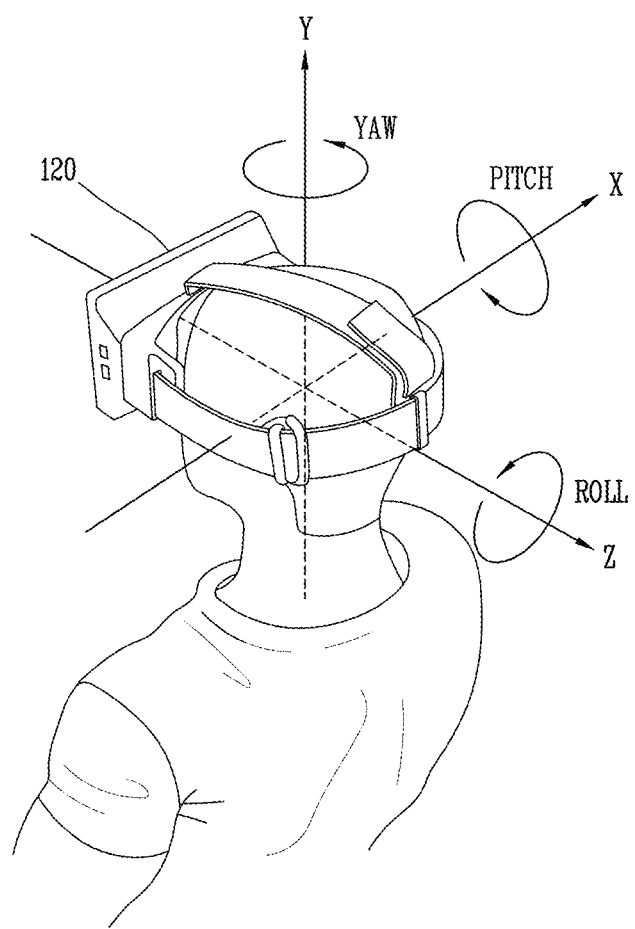
FIG. 2 is a view illustrating an example in which an operator wears a head-mounted display (HMD) in an apparatus for simulating a nuclear facility decommissioning operation according to an embodiment of the present disclosure.

FIG. 2 is a view illustrating an example in which an operator wears a head-mounted display (HMD) in an apparatus for simulating a nuclear facility decommissioning operation according to an embodiment of the present disclosure.

Referring to FIG. 2, the HMD 120 according to an embodiment of the present disclosure may be worn on the user's head. Also, the HMD 120 may have a display unit to display various virtual images related to a decommission operation of a nuclear facility. Also, the HMD 120 worn on the user's head may sense a change in yaw, pitch, roll to sense a direction of the user's eyes. Also, the simulation unit 100 may display a virtual image based on the sensed direction of the user's eyes on the HMD 120 within a virtual space generated according to a simulation currently in progress.

Also, the HMD 120 may further include at least one different sensor. As described above, it may be connected to a separate input device such as a sensor capable of recognizing a gesture of the user's hand or foot, a keypad, and the like, to receive an input signal from an operator who wears the HMD 120, and transmit the received input signal to the simulation unit 100.

Figure 3:
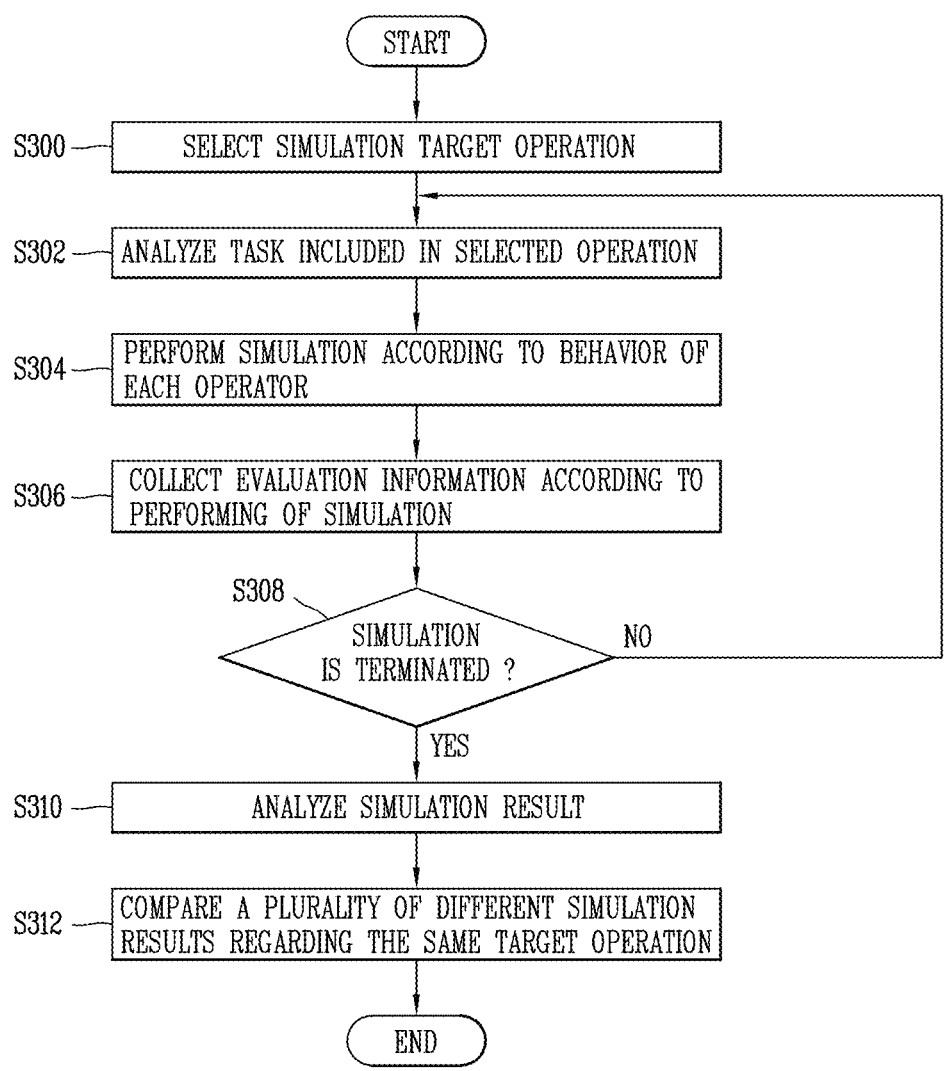
FIG. 3 is a flow chart illustrating an operational process of an apparatus for simulating a nuclear facility decommissioning operation according to an embodiment of the present disclosure.

FIG. 3 is a flow chart illustrating an operational process of an apparatus for simulating a nuclear facility decommissioning operation according to an embodiment of the present disclosure.

Referring to FIG. 3, the simulation unit 100 according to an embodiment of the present disclosure may receive a selected target operation to be simulated (S300). When a target operation is selected in step S300, the simulation unit 100 may analyze a task included in the selected operation.

A specific operation of decommissioning a nuclear facility may include at least one task. For example, in the case of an operation of decommissioning an overage fuel rod, a task of determining whether there is an error such as checking whether there is a leakage by checking a pressure valve, or the like, may be performed in advance. Also, a process of releasing a safety device of a fuel rod and tasks of releasing a lock device of the fuel rod after such a task is completed may be included in the specific decommissioning operation.

The tasks may be divided into tasks which may be simultaneously performed and tasks to be performed according to a preset order according to whether the tasks are associated. For example, when tasks are not greatly associated or not associated, the tasks may be separately simultaneously performed. In this case, multiple operators may separately perform the tasks, and accordingly, the tasks may be simultaneously performed.

Meanwhile, tasks which are associated with each other may have a preset order. That is, in the case of a facility in which a fuel rod cannot be decommissioned until a safety device is released, a task of decommissioning a lock device of the fuel rod may be performed after a task of releasing the safety device is completed. In this manner, among tasks included in the currently selected simulation operation, tasks having a preset order according to association therebetween and tasks which can be separately performed may be analyzed in step S302.

In addition, in step S302, various types of information included in each task may be analyzed. For example, in case where conditions for an operator to perform the corresponding task are previously designated, such conditions may be analyzed in step S302. For example, such conditions may be a position or a skill level of an operator. Also, in case where specific equipment or tool is required to perform a specific task, information regarding the required equipment or tool may be analyzed in step S302.

When analyzing a task included in the currently selected operation, or the like, is completed in step S302, the simulation unit 100 may perform simulation. Also, in this case, the simulation unit 100 may perform the simulation according to a behavior of each operator (S304). That is, the simulation unit 100 may provide information regarding a selected simulation target operation, i.e., tasks included in the corresponding operation, information related to the corresponding task, and a virtual space in which the simulation is performed to operators so that the tasks included in the operation may be performed in a selected order according to a behavior of each operator. To this end, when a simulation starts, the simulation unit 100 may display tasks included In the target operation and information regarding each task on the display unit of each of connected HMDs 120 and sense a behavior of each operator. Here, a behavior of an operator may include a gesture of the operator sensed through the HMD 120 or a behavior of inputting a signal through a separate input unit connected to the HMD 120.

Accordingly, in the present disclosure, when the plurality of operators perform a simulation of a specific operation, the tasks included in the simulation target operation may be performed in a certain order. That is, in the present disclosure, an operation is not performed according to a preset scenario and various tasks included in the target operation may be performed in order selected by multiple operators.

In this case, the simulation unit 100 may determine whether each task included in the currently simulated operation is in progress according to behaviors of operators sensed in step S304. Also, the simulation unit 100 may perform simulation according to a progress situation of the tasks. Also, the simulation unit 100 may simulate various situations generated according to a progress situation of the tasks and transmit a corresponding virtual image to each HMD 120. Also, each HMD 120 may display the virtual image received from the simulation unit 100 and information related thereto on the display unit provided in each HMD.

While performing the simulation, the simulation unit 100 may perform various evaluations according to progress of the simulation. Also, the simulation unit 100 may collect corresponding results (S306). For example, the simulation unit 100 may evaluate the currently performed simulation with respect to an evaluation reference such as an exposure dose of each operator, an amount of a waste, time required for the operation, and the like, generated according to an operation of each operator, and collect results.

The simulation unit 100 may measure and collect the evaluation results on the basis of a progress state of the tasks. In this case, time required for completing each task may be measured, and an exposure dose of radiation by which each operator who performs each task is exposed while performing the task, an amount of a generated waste, and the like, may be calculated.

Meanwhile, when the progress state of each task is used as a reference, an operator who does not perform the task may be evaluated. For example, in the case of an operator who does not perform the task and is in standby. The simulation unit 100 may measure an exposure dose of radiation to which the operator is exposed according to a location of the operator, and calculate a corresponding amount of waste.

Meanwhile, in step S306, the simulation unit 100 may collect evaluation results based on the progress of simulation according to another reference, as well as according to the task progress situation. For example, the simulation unit 100 may evaluate the currently performed simulation according to an exposure dose, an amount of generated waste, a required time, and the like, by preset time units, and collect evaluation results.

When the evaluation results are collected in step S306, the simulation unit 100 may determine whether the simulation has been terminated (S308). For example, the simulation unit 100 may determine whether the simulation has been terminated according to whether every task of the decommissioning operation being currently simulated is completed. Or, when a preset condition is met, the simulation unit 100 may determine that the simulation has been terminated although the tasks are not completed yet. That is, when a preset time expires or when a simulation termination condition is met (when an accident occurs due to a mistake of an operator or when a specific operator is excessively exposed to radiation), the simulation unit 100 may determine that the simulation has been terminated although the tasks are not completed yet.

When the simulation has not been terminated according to a determination result in step S308, the simulation unit 100 may return to step S304 to analyze a behavior of an operator and allow simulation to be performed according to a behavior of the operator. Also, the simulation unit 100 may perform evaluation according to a progress of the simulation and collect a corresponding result in step S306. The simulation unit 100 may determine whether the simulation is terminated in step S308.

Meanwhile, when it is determined that the simulation has been terminated in step S308, the simulation unit 100 may analyze a simulation result on the basis of the evaluation results collected in step S306 (S310).

First, the simulation unit 100 may analyze an operation route of each operator in step S310. Here, the operation route may include information regarding whether the tasks included in the target operation were performed simultaneously or information regarding a progress order in which the tasks were sequentially performed.

In step S310, the simulation unit 100 analyzes time required for each task, an operator which has performed the corresponding task, an exposure dose of radiation exposed to the operator, and an amount of a generated waste using the results collected in step S306. The analysis results may be results regarding contents of the terminated simulation, i.e., regarding an operation route selected by each operator regarding a release operation in which the current simulation was performed.

Meanwhile, in step S310, when a simulation is performed in the same operation route on the same target operation, a plurality of simulation results according to the operation route may be analyzed. That is, when a previously performed simulation has the same operation route as that of the currently performed simulation, the simulation unit 100 may perform analysis by integrating a result of the previously performed simulation and a result of the currently performed simulation. In this case, the simulation evaluation results, that is, time required for each task, an exposure dose, an amount of a generated waste, and the like, may be an average value of the simulation results.

Meanwhile, the simulation unit 100 may determine whether the currently performed simulation has been successfully performed or whether the previously performed simulation was successfully performed. For example, when every task of the target operation is completed before the simulation is terminated, the simulation unit 100 may determine that the target operation has been successfully completed. However, if the simulation is terminated before the tasks included therein are completed, the simulation unit 100 may determine that the target operation has not been completed yet. Also, the simulation unit 100 may calculate a probability in which the target operation is successfully completed, i.e., a success rate, when the tasks are performed according to an operation route based on the performed simulation contents, i.e., the simulation contents in the target operation, according to whether the operation is completed.

Meanwhile, when the results of the currently performed simulation is analyzed in step S310, the simulation unit 100 may compare a plurality of different simulation results regarding the same target operation. Here, the different simulation results may be simulation results of a case where tasks included in the same target operation are performed according to different operation routes. In this case, results obtained by comparing exposure doses of the operators according to respective task route, required times, amounts of generated wastes, success rates, and the like, may be displayed on the monitoring unit 130. Also, according to the comparison results, an operation route in which an operator is less exposed to radiation and a less waste is generated may be searched more rapidly or at a high success rate, with respect to the target operation, and it may be an optimal operation route regarding the simulation target operation.

Figure 4:
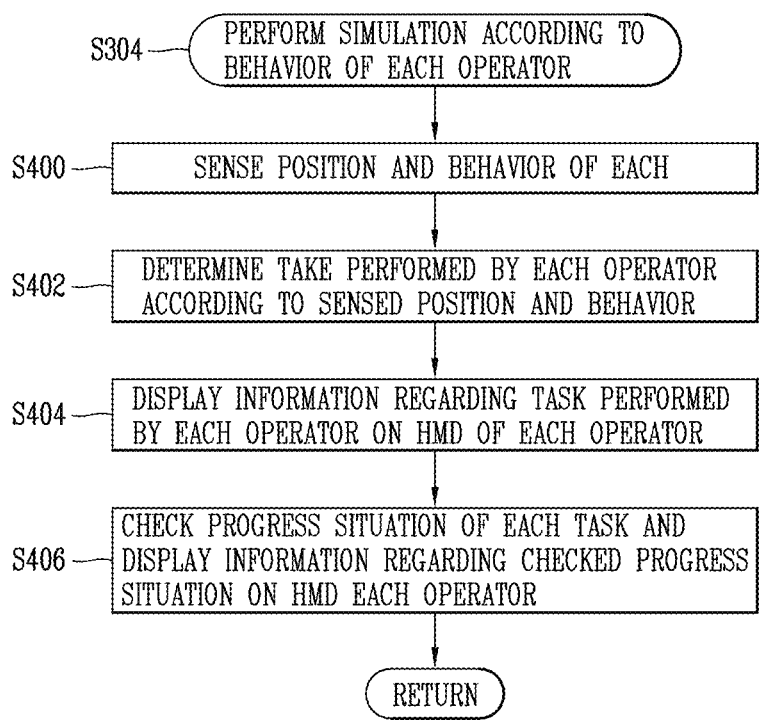
FIG. 4 is a flow chart illustrating an operational process of performing simulation according to an operator's behavior in the process illustrated in FIG. 2.

FIG. 4 is a flow chart illustrating an operational process of performing simulation according to an operator's behavior in the process illustrated in FIG. 2.

Referring to FIG. 4, in the simulation apparatus according to an embodiment of the present disclosure, the simulation unit 100 may sense a behavior and a position of each operator on the basis of information received through each HMD 120 in step S304 (S400). Also, the simulation unit 100 may determine a task performed by each operator on the basis of the sensed behavior of each operator (S402).

For example, the simulation unit 100 may perform a task performed by an operator according to a position of the corresponding operator. That is, when the specific operator approaches a region within a predetermined distance from a safety device of a fuel rod within a virtual space, the simulation unit 100 may determine that the specific operator performs the task related to the safety device of the fuel rod (e.g., releasing the safety device, etc).

Also, the simulation unit 100 may determine a task desired to be performed by the operator on the basis of the sensed behavior of the operator within the virtual space. That is, when the specific operator brings his hand, or the like, into contact with an object related to a specific task, e.g., a specific device (e.g., an object corresponding to the safety device), the simulation unit 100 may determine that the specific operator performs the specific operation (releasing the safety device, etc.).

Meanwhile, in order to more accurately determine a task performed by the operator, the simulation unit 100 may determine it on the basis of both a position and a behavior of the operator sensed within the virtual space.

Meanwhile, when tasks performed by each operator are determined, the simulation unit 100 may transmit information of the operators respectively corresponding to the tasks to each HMD 120. In this case, the information of the operators in charge of the respective tasks may be displayed on the HMDs 120 of the respective operators (S404). Thus, information of the operators in charge of the tasks may be shared with each other, and thus, the plurality of operators may simultaneously perform the plurality of tasks more effectively.

Meanwhile, the simulation unit 100 may check a progress state of tasks performed by each operator. For example, in case where the corresponding tasks include a plurality of processes, the simulation unit 100 may display a degree of progress of the tasks as percent (%), or the like, according to whether each process is performed. Also, the simulation unit 100 may also display information regarding the progress situation of each task on the display unit of a different HMD 120 (S406). Thus, the operators may simultaneously check a situation in which other tasks are in progress, as well as the tasks of their own. Thus, in the present disclosure, since the progress situations of the tasks associated with each other can be checked in real time, the tasks may be sequentially performed according to the association therebetween effectively.

In the above, an operational process of performing simulation of a specific operation in the apparatus for simulating a decommissioning operation according to an embodiment of the present disclosure has been described. Hereinafter, an example in which a plurality of operators perform simulation in union according to an embodiment of the present disclosure will be described in detail with reference to examples of virtual images displayed on the HMD 120 of the apparatus for simulating a decommissioning operation according to an embodiment of the present disclosure.

Figure 5A:
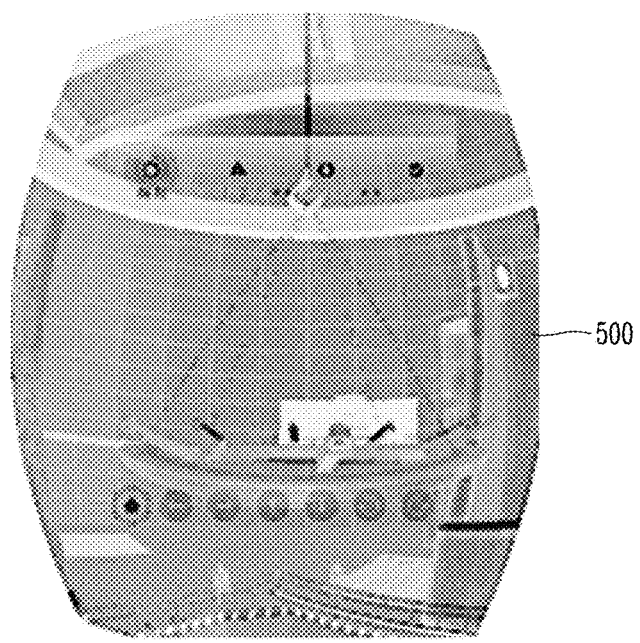
FIGS. 5A and 5B are views illustrating examples of screens in which simulation of decommissioning operation is performed, in a simulation apparatus according to an embodiment of the present disclosure.
Figure 5B:
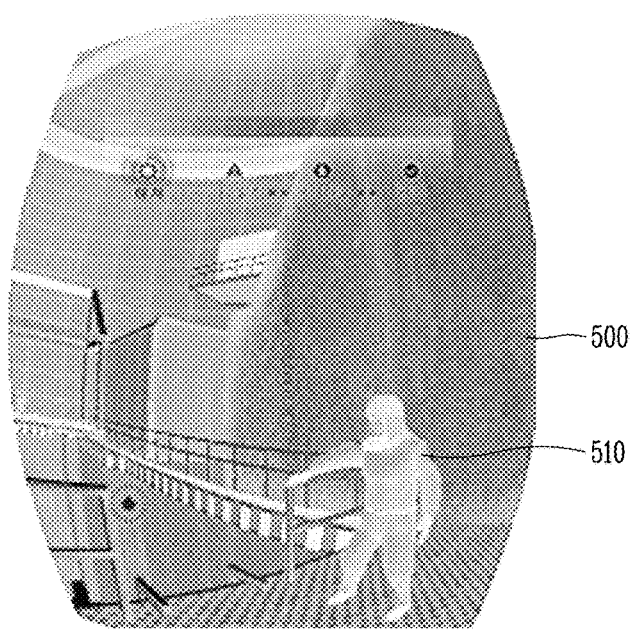

FIGS. 5A and 5B are views illustrating examples of screens in which simulation of decommissioning operation is performed, in a simulation apparatus according to an embodiment of the present disclosure.

FIG. 5A illustrates an example in which the HMD 120 displays a virtual image 500 transmitted from the simulation unit 100 according to an embodiment of the present disclosure. As illustrated in FIG. 5A, when a specific decommission operation is selected, the simulation apparatus according to an embodiment of the present disclosure may generate a virtual space regarding the selected operation and display an image of a direction corresponding to a direction of the operator's eyes on the display unit of the HMD 120 within the generated virtual space.

Meanwhile, the apparatus for simulating a decommissioning operation according to an embodiment of the present disclosure may be connected to the plurality of HMDs 120 as illustrated in FIG. 1. Thus, the simulation unit 100 of the present disclosure may transmit a virtual image regarding the same virtual space to the plurality of HMDs 120. Also, the simulation unit 100 may generate operator objects respectively corresponding to the plurality of HMDs 120 within the virtual space, and the generated operator objects may be displayed on display units of different HMDs 120. FIG. 5B illustrates an example of such a case.

That is, referring to FIG. 5B, FIG. 5B illustrates an example in which a different operator object 510 is displayed on the HMD 120. For example, in FIGS. 5A and 5B, when it is assumed that the HMD 120 displaying a virtual image 500 is a first HMD 120a, the operator object 510 may be the second HMD 120b. In this manner, in the simulation apparatus according to an embodiment of the present disclosure, when a plurality of operators perform simulation on the same decommissioning operation, operator objects respectively corresponding to the operators may be generated within the virtual space generated for the simulation of the decommissioning operation and displayed on the display unit provided in HMDs 120 of other operators. Also, the operator objects may be moved according to a behavior, a key input, or the like, of each operator, and a position may be moved or various operations related to a specific task may be performed within the virtual space according to such a movement.

Figure 6A:
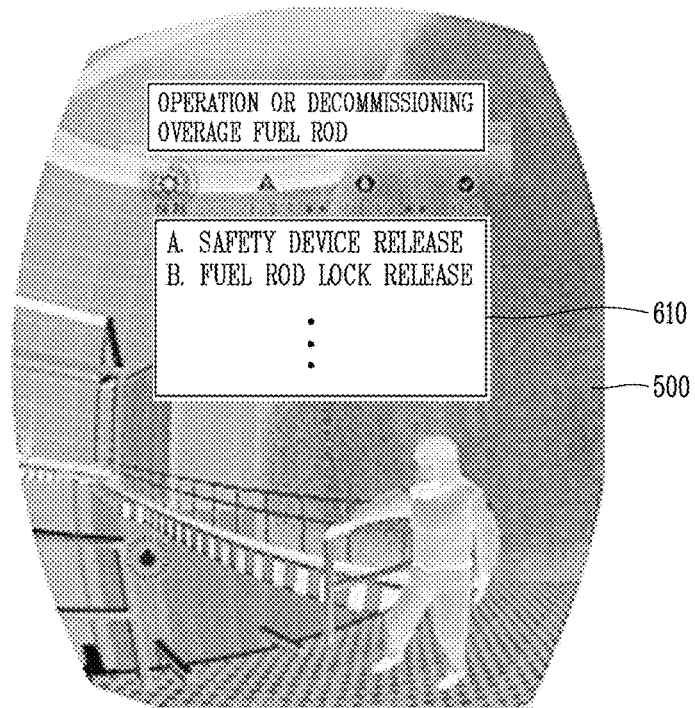
FIGS. 6A and 6B are views illustrating examples in which information regarding tasks included in a current decommissioning operation is displayed, in a simulation apparatus according to an embodiment of the present disclosure.
Figure 6B:
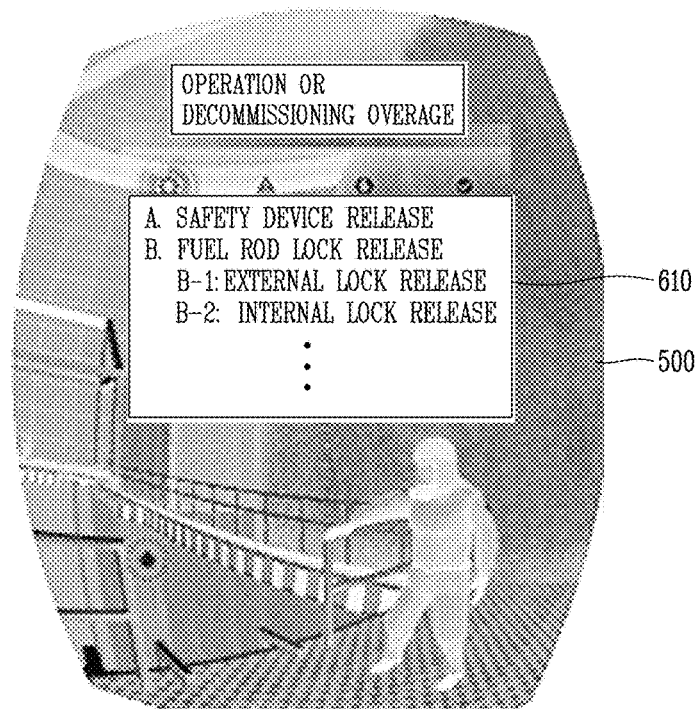

Meanwhile, in the apparatus for simulating a decommissioning operation according to an embodiment of the present disclosure, when a simulation target operation is selected, information regarding tasks included in the selected operation may be displayed on each HMD 120 as mentioned above. FIGS. 6A and 6B illustrate an example of such a case.

Referring to FIG. 6A, the HMD 120 included in the simulation apparatus according to an embodiment of the present disclosure may display an image of a virtual space, i.e., a virtual image 500, on the display unit. Also, information 600 regarding a decommissioning operation selected as the current simulation and information regarding a plurality of tasks included in the operation, i.e., task information 610 may be displayed on the virtual image 500.

Meanwhile, the tasks may be independently performed or may be dependently performed according to a preset order according to the presence or absence of association between the tasks or stress of association. For example, as illustrated in FIG. 6A, in the case of tasks which can be independently performed, the simulation unit 100 of the simulation apparatus according to an embodiment of the present disclosure may display related information in the same form. In this case, since the tasks can be independently performed, each task may be simultaneously performed by other operators.

However, in the case of the tasks in a dependent relation, the simulation unit 100 may display the tasks to be differentiated. That is, as in task information 650 illustrated in FIG. 6B, tasks 'external lock release' and 'internal lock release" dependent upon 'B. Fuel rod lock release' may be displayed to be differentiated from the 'B. Fuel rod lock release'. In addition, the simulation unit 100 may display the order of the dependent tasks according to association therebetween. In FIG. 6B, 'B-1' and 'B-2' indicate the order.

Figure 7:
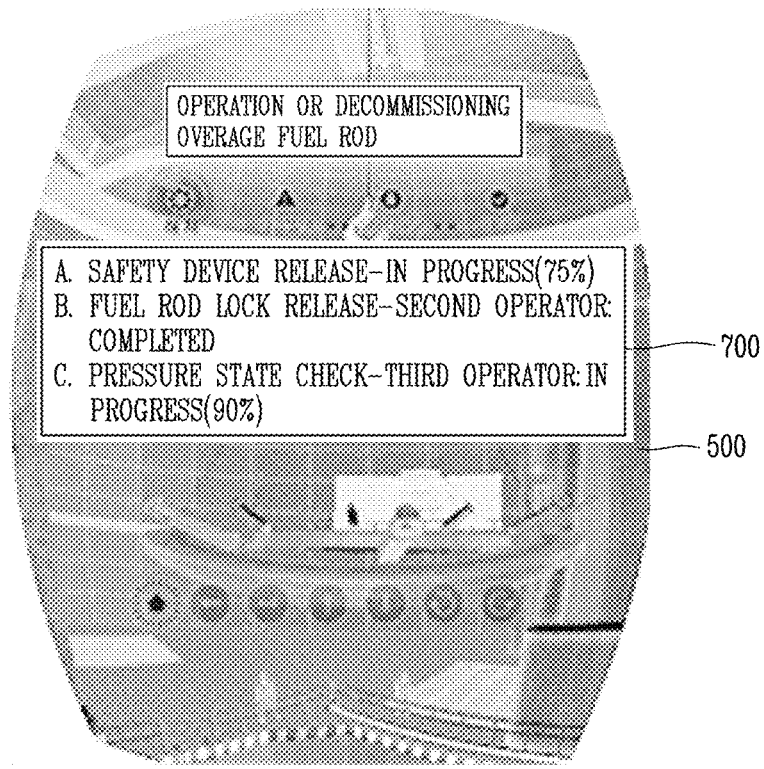
FIG. 7 is a view illustrating an example in which information regarding a progress situation of each task is shared, in a simulation apparatus according to an embodiment of the present disclosure.

As described above, the simulation apparatus of the present disclosure may determine a task performed by each operator according to a behavior of each operator and a progress state of the task performed by each operator may be displayed. FIG. 7 is a view illustrating an example in which information regarding a progress situation of each task is shared, in the simulation apparatus according to an embodiment of the present disclosure.

Referring to FIG. 7, FIG. 7 illustrates an example in which information regarding tasks included in a currently simulated operation and information regarding tasks currently in progress, i.e., task progress information 700, are displayed. Also, as shown in the task progress information 700 of FIG. 7, the task progress information 700 may include information regarding operators who perform respective tasks and may further include information regarding a progress situation of each task. Thus, in the present disclosure, each operator may share information regarding a progress situation of each task, and thus, tasks may be effectively divided to be shared between the operators.

Meanwhile, as illustrated in FIG. 7, the task progress information 700 may be displayed in a transparent overlay form, so that image information of the virtual screen 500 may be distinguishable even in a state in which the task progress information 700 is displayed. Thus, unlike the task information 600 or 650 illustrated in FIGS. 6A and 6B, the task progress information 700 may be continuously displayed while the simulation is being performed, and information regarding a progress situation of the tasks may be provided to the operators.

Figure 8:
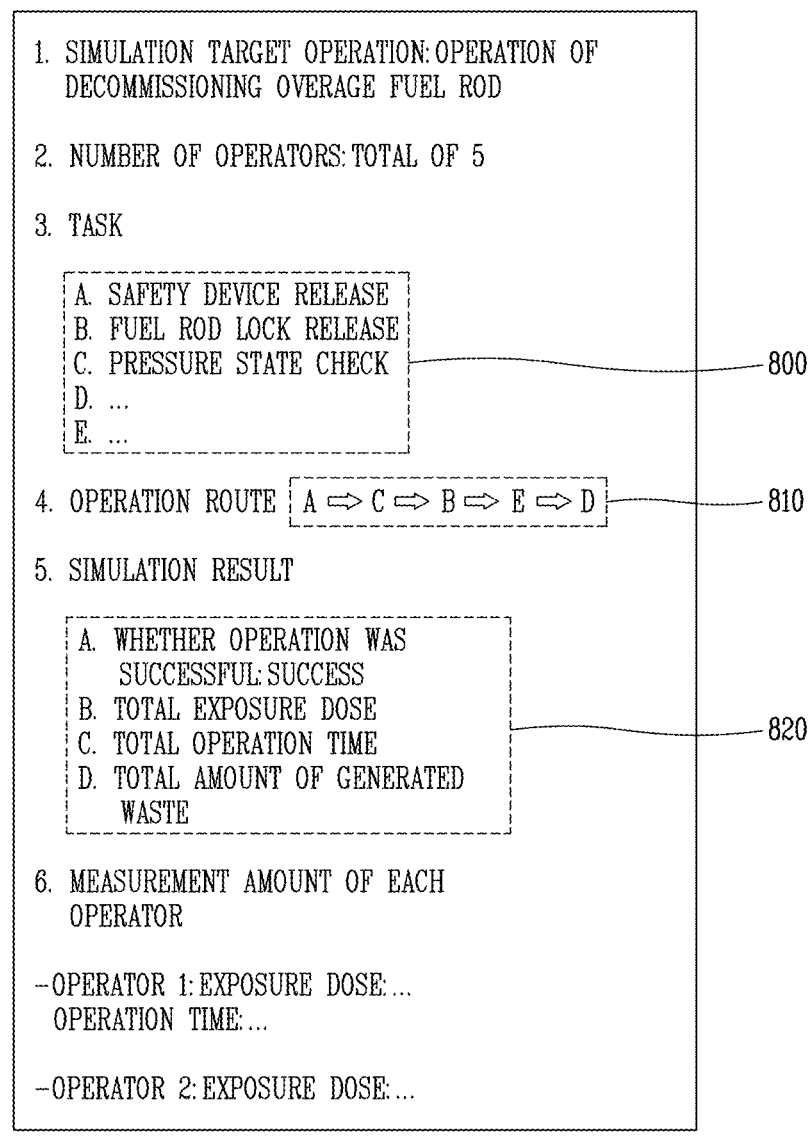
FIG. 8 is a view illustrating an example of displaying simulation results, in a simulation apparatus according to an embodiment of the present disclosure.

FIG. 8 is a view illustrating an example of displaying simulation results, in a simulation apparatus according to an embodiment of the present disclosure.

Referring to FIG. 8, when a preset condition is met, the simulation apparatus according to an embodiment of the present disclosure may determine that simulation has been terminated, and when the simulation is terminated, the simulation apparatus may analyze and evaluate simulation results on the basis of information collected during the simulation and various evaluation references.

The simulation analysis and evaluation may include various types of information as illustrated in FIG. 7. That is, the simulation analysis and evaluation may include the number of operators mobilized for the simulation, a list 800 of tasks included in the simulation target operation, an order in which tasks of the operators are performed, that is, information 810 regarding an operation route. Also, the simulation analysis and evaluation may include evaluation information 820 measured according to various evaluation references such as whether a corresponding task determined on the basis of a preset termination reference, i.e., a limited time, and the like, is successful, a total exposure dose, a total operation time, an amount of generated waste. Also, the simulation analysis and evaluation may further include various values measured by each operator.

Meanwhile, the simulation analysis and evaluation may be evaluation results regarding the number of operators and the order of tasks in which the operators perform the tasks of the corresponding operation, i.e., an operation route. As described above, in the present disclosure, since information regarding each task is provided in advance and information of each operator handling each task and information regarding a progress situation of each task are divided to be shared in real time, time required for sharing the tasks and checking a progress situation of tasks during the simulation process, in addition to time required for performing each task, may be minimized.

Figure 9:
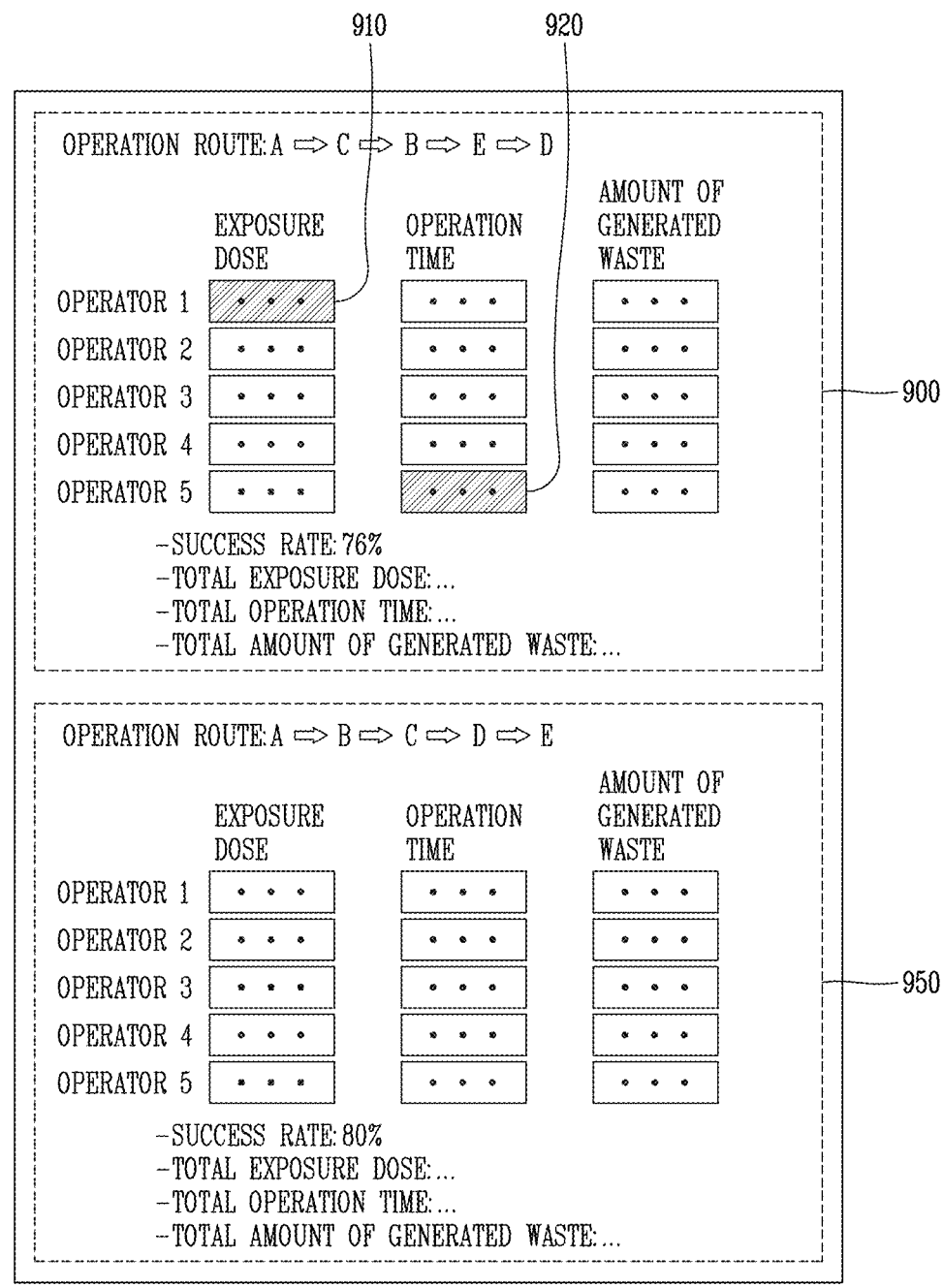
FIG. 9 is a view illustrating an example of comparatively displaying a plurality of simulation results, in a simulation apparatus according to an embodiment of the present disclosure.

Thus, in the present disclosure, the plurality of simulation evaluation and analysis results may be compared on the basis of at least one of the number of operators and the operation route. FIG. 9 is a view illustrating an example of comparatively displaying a plurality of simulation results, in a simulation apparatus according to an embodiment of the present disclosure.

Referring to FIG. 9, FIG. 9 illustrates an example of displaying results obtained by performing simulation of the same operation by different operation routes, with reference to operation routes. First, a first simulation result 900 illustrates a simulation result obtained by performing a task in order of A→C→B→E→D when simulation target operation includes five tasks of A, B, C, D, E, and a second simulation result 950 illustrates a simulation result obtained by performing a task in order of A→B→C→D→E.

In this case, the simulation unit 100 may display a result obtained by comparing the plurality of simulation results on the monitoring unit 130. For example, as illustrated in FIG. 9, the simulation unit 100 may display measurement values which are significantly different by a preset degree or greater to be distinguished from each other in the plurality of simulation results. That is, like an exposure dose 910 of a first operator and an operation time 920 of an operator 5 in the first simulation result 900, the simulation unit 100 of the simulation apparatus according to an embodiment of the present disclosure may display parts in which values are measured to be greater or smaller by a preset degree or greater, compared with other simulation results, to be distinguished.

That is, although a similar measurement result or a better measurement result is obtained, if a specific result value is abnormally bad, it is displayed to be distinguished so that an analyzer or an evaluator may check the value more carefully. Also, through the simulation comparison result, the analyzer or evaluator may determine a most effective operation route regarding a target operation. Thus, in the present disclosure, regarding a specific operation, an optimal operation route in which an exposure dose is smaller may be searched, without having to conduct a plurality of experiments according to various operation routes by an actual operator on an operation site.

Meanwhile, in the description of FIG. 9, the example in which the simulation analysis results are compared with respect to the operation route is illustrated, but the simulation results may also be compared according to the number of operators in a similar manner. Also, the simulation results may also be compared with reference to both the number of operators and an operation route, as well as with reference to any one thereof. In this case, an optimal number of operators, as well as an optimal operation route regarding the corresponding operation, may be determined.

Meanwhile, in the above description, a specific embodiment has been described, but various modifications may be made without departing from the scope of the present disclosure. In particular, in an embodiment of the present disclosure, an exposure dose, an operation time, a success rate, and an amount of generated waste are mentioned as references for evaluating simulation, for example, but any other evaluation reference may be further included. Also, in the above description, simulation of the operation of decommissioning a nuclear facility is described as an example, but the present disclosure may also be applied to various cases for searching for an optimal operation route in an environment in which a plurality of experiments cannot be conducted due to an influence of temperature, pressure, and radiation, as well as to the operation of decommissioning a nuclear facility.

Although a few exemplary embodiments have been shown and described, it will be appreciated by those skilled in the art that changes may be made in these exemplary embodiments without departing from the principles and spirit of the invention, the range of which is defined in the appended claims and their equivalents. Accordingly, the exemplary embodiments of the present invention are provided to explain the technical spirit of the present invention but not to limit such spirit. The scope of the technical spirit of the present invention is not limited by the exemplary embodiments of the present invention. The scope of protection of the present invention should be interpreted by the claims below, and all technical spirits which are in the same scope would be interpreted as being included in the scope of right of the present invention.

The invention claimed is:

1. A simulation apparatus comprising:
   a database including information on at least one task constituting a nuclear facility decommissioning operation and information regarding a virtual space related to the simulation of the decommissioning operation;
   a plurality of head mounted displays (HMDs) receiving inputs from users related to the simulation and outputting an image of the virtual space related to the simulation; and
   a simulation unit generating the virtual space, transmitting, to the plurality of HMDs, an image of the virtual space including operator objects respectively corresponding to the users of the plurality of HMDs, and performing the simulation of the decommissioning operation according to inputs received respectively from the HMD users,
   wherein, when simulations which are different in at least one of the number of the users and a progress order of the tasks are performed, the simulation unit compares at least one of measurement values measured from each simulation with at least one of the number of the users and the progress order of the tasks and displays a comparison result.

2. The simulation apparatus of claim 1, wherein
   the simulation unit determines tasks performed by each user on the basis of a position or behavior of an operator object which performs simulation according to an input received from each operator object, and displays information related to the tasks handled by each user on the plurality of HMDs.

3. The simulation apparatus of claim 2, wherein
   the simulation unit further displays information regarding a progress situation of the tasks on each of the plurality of HMDs.

4. The simulation apparatus of claim 1, wherein
   the measurement value is at least one of an accumulated amount of radiation expose to each of the operator objects, an amount of waste generated as each task is in progress, and time required for each operator object to complete a specific task, while the simulation is being performed.

5. The simulation apparatus of claim 1, wherein
   when the simulation of decommissioning operation is terminated, the simulation unit generates a simulation performing result including the measurement values, determines whether the simulated decommissioning operation has been successful or failed according to a preset reference, and further includes a determination result in the measurement value.

6. The simulation apparatus of claim 5, wherein
when a plurality of simulations in which the number of users and the progress order of tasks are the same are performed,
the simulation unit calculates a success rate of the simulated decommissioning operation regarding any one of the number of users and the progress order of the tasks on the basis of the number in which the decommissioning operation was successful among the plurality of simulations, and further includes the calculated success rate as the measurement value.

7. The simulation apparatus of claim 5, wherein
the preset reference is at least one of whether all the tasks constituting the decommissioning operation have been completed within a preset time and whether an exposure does accumulated in the operator object exceeds a preset level.

8. The simulation apparatus of claim 1, wherein
the simulation unit displays a measurement value measured to be greater or smaller than those of other simulation performing results by a preset level or greater, among measurement values measured from simulations in which at least one of the number of users and the progress order of the tasks is different, to be distinguished from other measurement values.

9. A simulation method comprising:
analyzing tasks constituting an operation of decommissioning a nuclear facility selected as a simulation target;
generating a virtual space related to the decommissioning operation and operator objects corresponding to the number of a plurality of head-mounted displays (HMDs) within the virtual space;
displaying an image of the virtual space including the operator objects on each of the plurality of HMDs;
performing simulation of the decommissioning operation within the virtual space through the operator objects according to an input received from a user of each of the plurality of HMDs;
determining whether the simulation is terminated according to whether a preset conditions is met; and
displaying a result obtained by comparing measurement values measured from simulations performed on the same decommissioning operation, among terminated simulations, with at least one of the number of users and the progress order of the tasks.

10. The method of claim 9, wherein
the image of the virtual space further includes information regarding tasks constituting the decommissioning operation.

11. The method of claim 9, wherein
the displaying of the image of the virtual space includes:
sensing a position or a behavior of an operator object performing the simulation;
determining tasks performed by each operator object on the basis of the sensed position or behavior of the operator object; and
displaying information regarding the tasks and the operator object which performs the tasks on each of the plurality of HMDs.

12. The method of claim 11, wherein
the displaying of the information regarding the operator object further includes information regarding a progress situation of the tasks.

13. The method of claim 9, wherein
the measurement value is at least one of an accumulated amount of radiation expose to each of the operator objects, an amount of waste generated as each task is in progress, and time required for each operator object to complete a specific task, while the simulation is being performed.

14. The method of claim 9, wherein
the displaying of the comparison result further includes:
displaying a measurement value measured to be greater or smaller than those of other simulation performing results by a preset level or greater, among the measurement values, to be distinguished from other measurement values.

* * * * *